United States Patent [19]

Shimizu et al.

[11] Patent Number: 4,612,565
[45] Date of Patent: Sep. 16, 1986

[54] SEMICONDUCTOR MEMORY DEVICE

[75] Inventors: Shinji Shimizu, Houya; Hiroyuki Miyazawa, Kokubunji, both of Japan

[73] Assignee: Hitachi, Ltd., Tokyo, Japan

[21] Appl. No.: 783,531

[22] Filed: Oct. 3, 1985

Related U.S. Application Data

[63] Continuation of Ser. No. 375,697, May 6, 1982.

[30] Foreign Application Priority Data

May 27, 1981 [JP] Japan .................................. 56-79210

[51] Int. Cl.⁴ ..................... H01L 29/46; H01L 29/54; H01L 29/62
[52] U.S. Cl. ......................................... 357/71; 357/59; 357/23.1; 357/23.6; 357/45; 357/65; 365/186
[58] Field of Search ..................... 357/59, 71, 65, 23.1, 357/23.6, 45; 365/186

[56] References Cited

U.S. PATENT DOCUMENTS

| | | | |
|---|---|---|---|
| 4,021,789 | 5/1977 | Furman et al. | 357/23 C |
| 4,128,670 | 12/1978 | Gaensslen | 357/71 S |
| 4,329,706 | 5/1982 | Crowder et al. | 357/71 S |
| 4,339,766 | 7/1982 | Rao | 357/23 C |
| 4,348,746 | 9/1982 | Okabayashi et al. | 357/23 S |
| 4,355,374 | 10/1982 | Sakai et al. | 357/23 C |
| 4,356,622 | 11/1982 | Widmann | 357/71 S |
| 4,362,597 | 12/1982 | Fraser et al. | 357/71 S |
| 4,388,121 | 6/1983 | Rao | 357/23 C |

FOREIGN PATENT DOCUMENTS

| | | | |
|---|---|---|---|
| 0002165 | 5/1979 | European Pat. Off. | 357/71 S |
| 2857584 | 6/1975 | Fed. Rep. of Germany | 357/71 |
| 2852049 | 6/1979 | Fed. Rep. of Germany | 357/23.6 |
| 2934582 | 3/1980 | Fed. Rep. of Germany | 357/71 |
| 2815605 | 6/1980 | Fed. Rep. of Germany | 357/71 |
| 55-140271 | 12/1981 | Japan | 357/71 S |
| 2019091 | 10/1979 | United Kingdom | 357/71 S |
| 2087148 | 5/1982 | United Kingdom | 357/71 S |

OTHER PUBLICATIONS

Chao et al, *IEEE Int. Sol. St. Circ. Conf.*, vol. 24, 1981, Feb., N.Y., "A 34 μm² DRAM . . . Technology", pp. 152-153.

*IBM Tech. Disc. Bull.*, vol. 22, No. 12, May 80, pp. 5466-5467, Crowder et al, "Improved Conductivity Polysilicon Lines . . . Tech.".

Yanagawa et al, "A 1 μm Mo-Poly . . . ", *IEEE Trans. on Elec. Dev.*, vol. ED-27, No. 8, Aug. 1980, pp. 1602-1606.

Murerka et al, "Refractory Silicides . . . Interconnects", *IEEE Journal of Solid State Circuits*, vol. SC-15, No. 4, Aug. 1980, pp. 474-482.

Crowder et al, "1 μm . . . Perspective", *IEEE Trans. on Elec. Dev.*, vol. Ed-26, No. 4, Apr. 79, pp. 369-371.

Primary Examiner—Martin H. Edlow
Assistant Examiner—Jerome Jackson, Jr.
Attorney, Agent, or Firm—Antonelli, Terry & Wands

[57] ABSTRACT

In a dynamic memory having a plurality of memory cells each of which consists of a MIS type field effect transistor and a charge storing capacitor connected thereto; a dynamic memory is disclosed wherein one electrode of the capacitor is made of a semiconductor layer which is formed on a semiconductor body through an insulating film and wherein a word line a part of which serves as a gate electrode of the MIS type field effect transistor is made of a conductor layer of multilayer structure which consists of a layer of semiconductor and a high-fusing metal layer containing the semiconductor.

15 Claims, 29 Drawing Figures

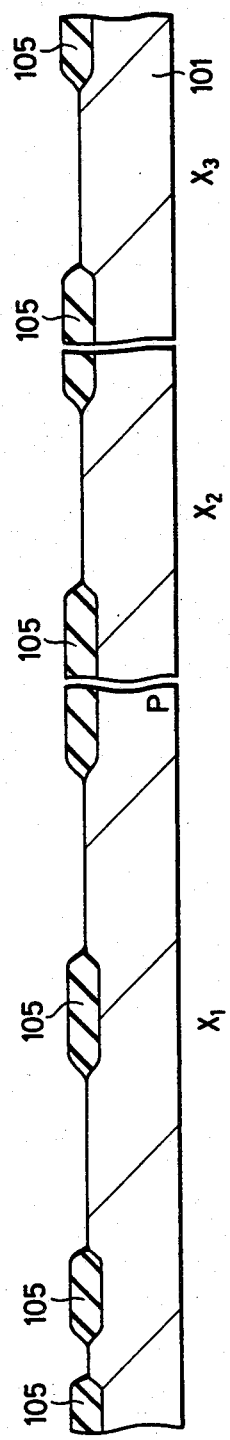
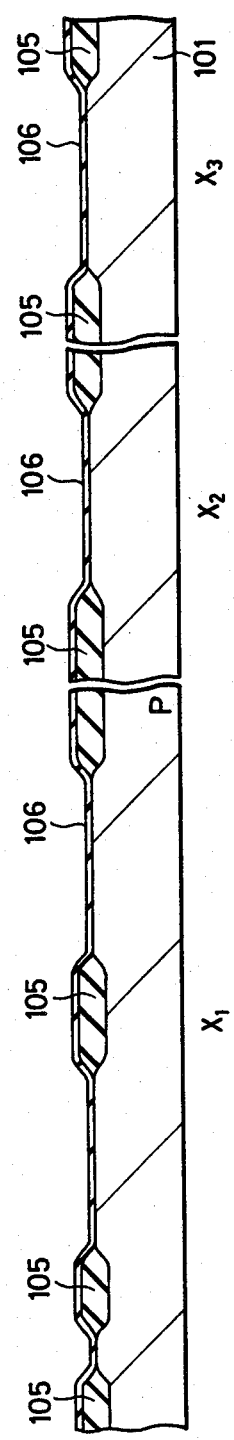
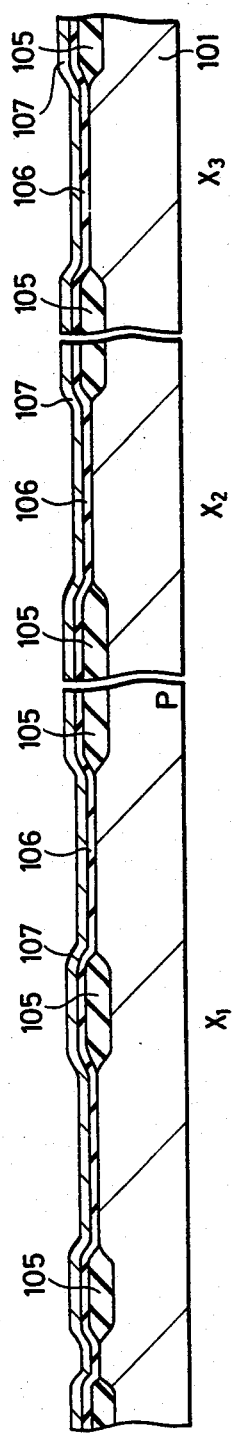

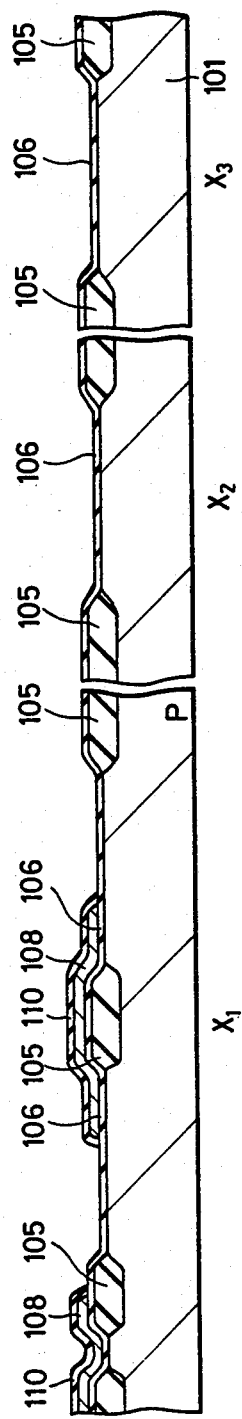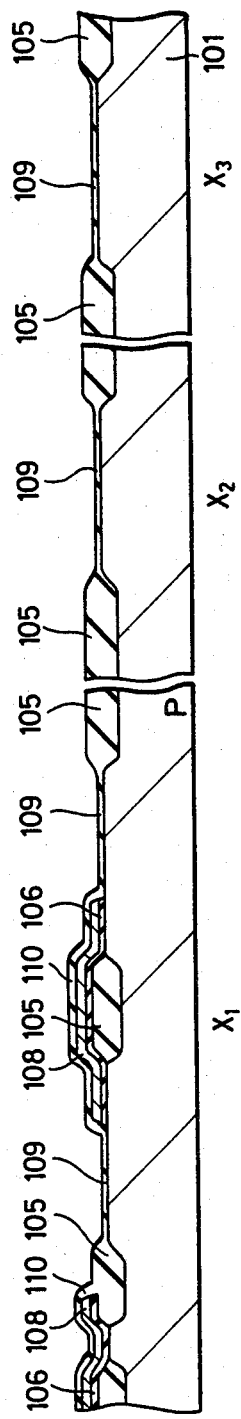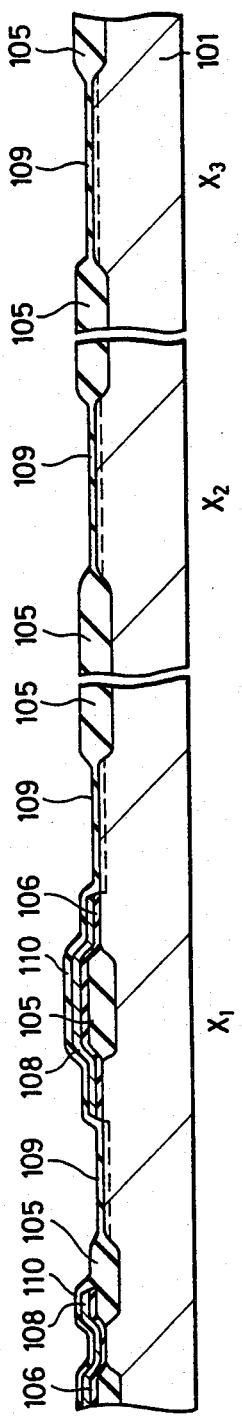

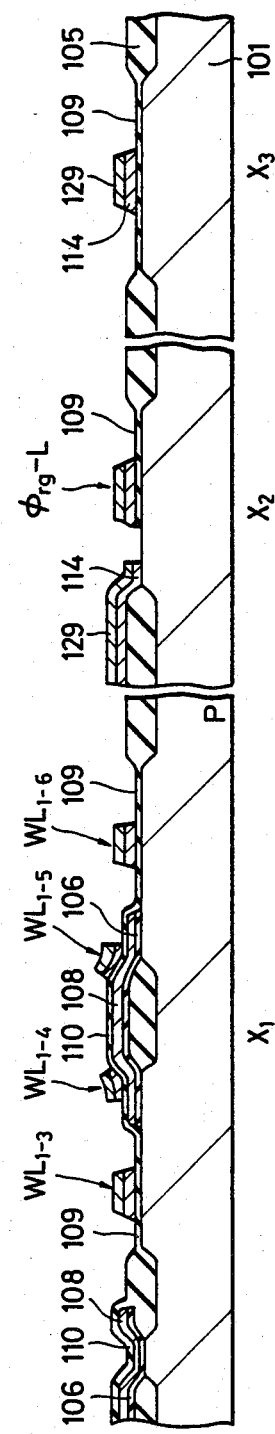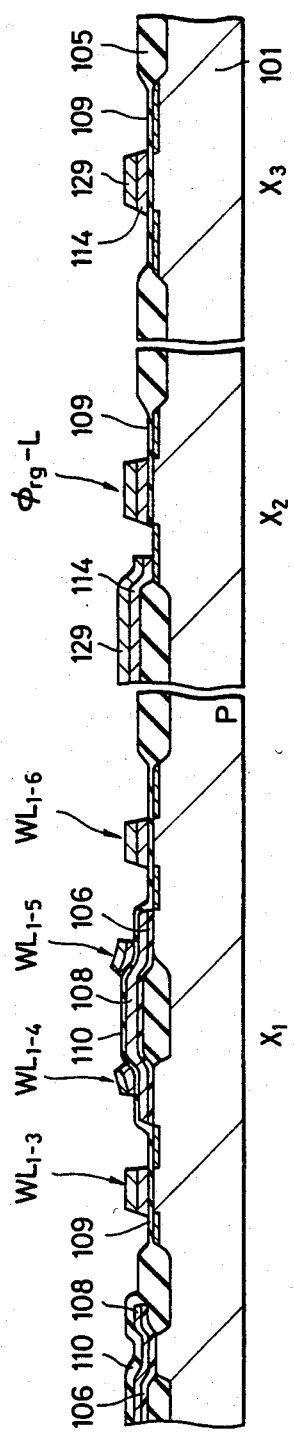

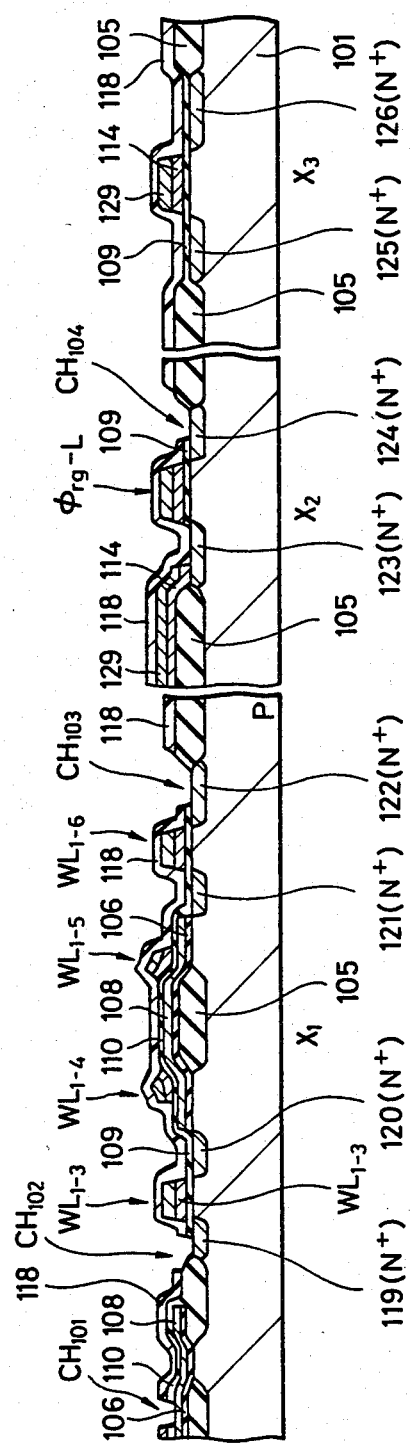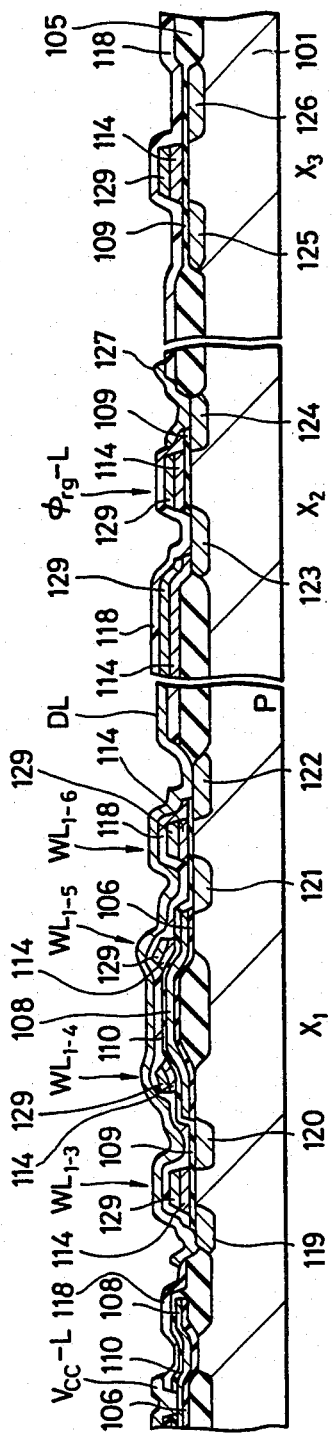

4,612,565

SEMICONDUCTOR MEMORY DEVICE

This is a continuation of application Ser. No. 375,697, filed May 6, 1982.

BACKGROUND OF THE INVENTION

The present invention relates to a semiconductor memory device, and more particularly to a dynamic random access memory (hereinbelow, abbreviated to "D-RAM").

In order to make a semiconductor memory device of the MIS (Metal-Insulator-Semiconductor) type high in the operating speed and high in the integration density or packaging density, it has been considered to employ a high-fusing metal, that is, a refractory metal, such as molybdenum (Mo), tantalum (Ta) and tungsten (W), as the material of the gate electrodes of the memory device. Such metal materials have the advantage that they are lower in resistivity than polycrystalline silicon etc., and the advantage that in forming source and drain regions, they can be self-aligned likewise to polycrystalline silicon. Therefore, they are very effective for realizing the high operating speed and high packaging density of the semiconductor memory device.

Especially in the D-RAM, it is eagerly requested to achieve high operating speed and high packaging density. A D-RAM employing the aforementioned metal material is described in, for example, a literature "IEEE Transactions on Electron Devices, Vol. ED-27, No. 8, August 1980", p. 1602–1606. According to the literature, a polycrystalline silicon layer which is a first layer of wiring is utilized as the gate electrode of each of the insulated gate type field effect transistors (hereinbelow, termed "MISFETs") of a peripheral circuit for operating a memory cell and as one electrode of the charge storing capacitor of the memory cell, and a molybdenum layer which is a second layer of wiring is used as the gate electrode of a MISFET in the memory cell, that is, as a word line.

That is to say, the molybdenum layer is used only within a memory array which is constructed of a plurality of memory cells.

In applying such refractory metal, the inventors took notice of latent problems as follows:

The refractory metal film is inferior in the close adhesion with an $SiO_2$ film etc. Impurities such as sodium ions which mix in a manufacturing process are liable to penetrate through the metal film, and they reach the interface between Si and $SiO_2$ and varies a threshold voltage ($V_{th}$), so that a MISFET having stable characteristics cannot be obtained. Particularly in a MISFET which constitutes a peripheral circuit such as sense amplifier requiring to reliably amplify a minute signal, unlike a MISFET within a memory cell, it was improper to use only the refractory metal as the gate electrode of the MISFET.

Further, notwithstanding that a wiring layer made of the refractory metal is formed on a field insulating film having been formed by applying the LOCOS (Local Oxidation of Silicon) technique which affords a gentle step, the same refractory metal is employed for the second wiring layer, and hence, breaking is prone to occur in the place of the second wiring layer intersecting with the first wiring layer.

The present invention has been made on the basis of the notice of the latent problems described above.

SUMMARY OF THE INVENTION

The principal object of the present invention is to provide a semiconductor memory device which is fast in operation and high in reliability.

Another object of the present invention is to provide a dynamic memory which is fast in operation and high in reliability.

According to one aspect of performance of the present invention, in a dynamic memory, the plate electrode of a charge storing capacitor in a memory cell is constructed of a first layer of silicon, and the gate electrode of a MISFET is constructed of a conductor layer of a multilayer structure comprising a second layer of silicon which is formed by a process separate from that of the first layer of silicon and a layer of a refractory metal of molybdenum, tungsten or tantalum which contains silicon (hereinafter, such multilayer structure is called "polycide", and the refractory metal which contains silicon is called "silicide").

According to another aspect of performance of the present invention, the gate electrode of a MISFET which constitutes a peripheral circuit, such as sense amplifier and decoder, disposed in association with an array of memory cells is also constructed of the conductor layer of polycide which comprises the second layer of silicon and the silicide layer.

Hereunder, the present invention will be described in detail with reference to the drawings.

BRIEF DESCRIPTION OF THE DRAWINGS

FIGS. 11 to 26 are sectional views of the 64 kbit D-RAM of the present invention in the various steps of the manufacturing process thereof.

DESCRIPTION OF THE PREFERRED EMBODIMENTS

Hereunder, the present invention will be described in conjunction with practicable embodiments. In the embodiments described below, the present invention is applied to a 64 kbit D-RAM of the one-device cell type.

Figure 1A:
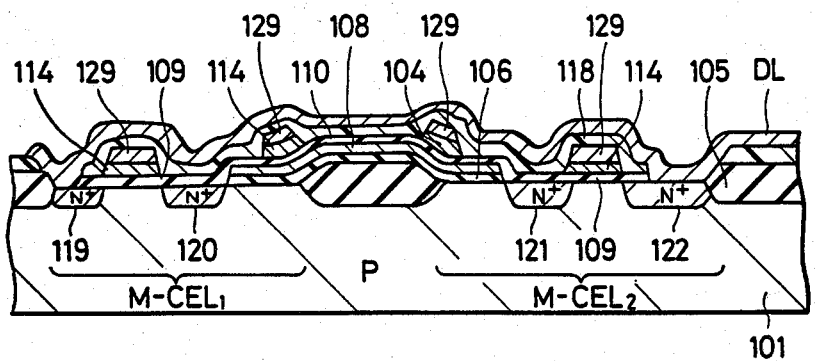
FIG. 1A is a partial sectional view showing a memory cell structure within the memory array of a semiconductor memory device according to the present invention.
Figure 1B:
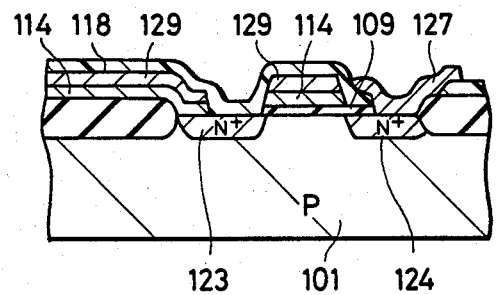
FIG. 1B is a partial sectional view showing the structure of a MISFET which is formed in the periphery of the memory array of the semiconductor memory device according to the present invention.

First, reference is had to FIGS. 1A and 1B. FIG. 1A is a partial sectional view showing a memory cell structure within a memory array, while FIG. 1B is a partial sectional view showing a MISFET structure which is constructed in the periphery of the memory array.

Referring to FIG. 1A, two memory cells are formed on a P-type silicon substrate 101. More specifically, a film 105 of field silicon oxide $SiO_2$ for insulating isolation is formed in the substrate 101, and the memory cells M-CEL$_1$ and M-CEL$_2$ are respectively formed in the upper surface parts of the substrate 101 surrounded with the field $SiO_2$ film 105.

The memory cell M-CEL$_1$ is constructed of a MISFET whose source and drain regions are N$^+$-type regions 119 and 120 formed in the selected parts of the substrate 101, respectively, and whose gate electrode is a conductor layer of a multilayer structure consisting of a polycrystalline silicon layer 114 and a silicon-containing molybdenum layer 129 that are formed through a gate $SiO_2$ film 109 on the surface of the substrate 101 between the N$^+$-type regions 119 and 120; and a charge storing capacitor whose one electrode (plate electrode) is a polycrystalline silicon layer 108, whose dielectric layer is an $Si_3N_4$ film 106 and whose other electrode is an N-type inversion layer (not shown) that is induced under the gate $SiO_2$ film 109.

On the other hand, the memory cell M-CEL$_2$ is constructed of a MISFET whose source and drain regions are N$^+$-type regions 121 and 122 formed in the selected parts of the substrate 101, respectively, and whose gate electrode is a conductor layer of a multilayer structure consisting of a polycrystalline silicon layer 114 and a silicon-containing molybdenum layer 129 that are formed through a gate $SiO_2$ film 109 on the surface of the substrate 101 between the N$^+$-type regions 121 and 122; and the charge storing capacitor whose one electrode (plate electrode) is the polycrystalline silicon layer 108, whose dielectric layer is the $Si_3N_4$ film 106 and whose other electrode is the N-type inversion layer induced under the gate $SiO_2$ film 109.

As apparent from the figure, the polycrystalline silicon layer 108 serves as the common electrode of the capacitors in all the memory cells. The N-type inversion layer is induced by applying a supply voltage $V_{CC}$ to this polycrystalline silicon layer 108. Although the common electrode of the capacitors is made of the polycrystalline silicon layer of comparatively high resistivity, it does not affect the operating speed of the D-RAM at all because the fixed voltage (supply voltage $V_{CC}$) is normally applied thereto.

The multilayer-structure conductor layer (114, 129) is the gate electrode of the MISFET and is also a wiring layer called "word line".

Formed on the polycide conductor layer (114, 129) as an inter-layer insulating film is a phospho-silicate glass (PSG) film 118, which is overlaid with a data line DL that is made of aluminum and that is connected to the N$^+$-type regions 119 and 122.

Referring to FIG. 1B, a single MISFET is formed on the P-type silicon substrate 101. By way of example, this MISFET has its source region, drain region, gate insulating film, and gate electrode made up of an N$^+$-type region 123, N$^+$-type region 124, gate $SiO_2$ film 109, and conductor layer of a polycide consisting of a polycrystalline silicon layer 114 and a silicon-containing molybdenum layer 129, respectively. The same multilayer-structure conductor layer (114, 129) as that of the gate electrode is connected to the N$^+$-type region 123, while a conductor layer (wiring layer) 127 made of aluminum is connected to the N$^+$-type region 124. The MISFET of such structure constructs a peripheral circuit, for example, sense amplifier.

In the following, there will be stated effects which are attained by the construction of the present invention:

(1) The word line and the gate electrode of the MISFET in the peripheral circuit can sufficiently endure the temperature of impurity diffusion for forming the source and drain regions, and their principal constituent is the refractory metal material of low resistivity. It is accordingly possible to form the source and drain regions in the selected parts by employing the gate electrodes as a mask, so that the occupying area of the MISFETs becomes small. Accordingly, a highly packaged D-RAM can be obtained. In addition, the operating speed becomes higher than in a D-RAM which uses polycrystalline silicon for word lines etc. More specifically, the resistivity of the polycide conductor layer is 80 to 150 $\mu\Omega\cdot$cm, which is about one order lower than the resistivity of the polycrystalline silicon used in the prior-art D-RAM. Accordingly, a D-RAM which is shorter in the delay time of signals than the prior-art D-RAM can be obtained.

Figure 1C:
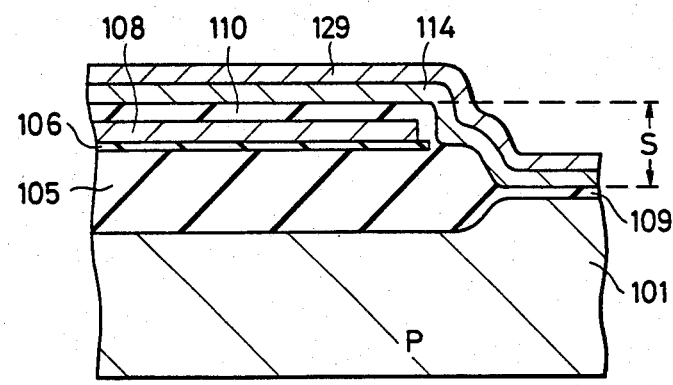
FIG. 1C is a partial sectional view of a portion in which a first layer of wiring and a second layer of wiring intersect within the memory array of the semiconductor memory device according to the present invention.

(2) As the word line, there is employed the conductor layer of the multilayer structure consisting of the polycrystalline silicon layer and the refractory metal layer formed thereon. That is, the lower conductor layer of the word line is made up of the polycrystalline silicon layer which is good in the step coverage and the close adhesion to an insulating film, especially $SiO_2$ film. Accordingly, even when the inter-layer insulating film between the plate electrode of the capacitor being the first layer and the word line being the second layer is formed to be thick to the end of reducing the capacitance between lines, the breaking of the word line is difficult to occur. That is, even when the step S from the surface of the gate $SiO_2$ film 109 to the surface of the inter-layer insulating film 110 becomes large as shown in FIG. 1C, the polycide conductor layer (114, 129) used as the word line is difficult to break. Therefore, the inter-layer insulating film 110 can be formed sufficiently thick by, for example, the CVD (Chemical Vapor Deposition) process without relying on the oxidation of the polycrystalline silicon layer 108 used as the plate electrode. In consequence, the capacitance between lines becomes low, so that the time constant of the word line becomes small and that the propagation delay time of signals is sufficiently shortened.

On the other hand, in case the conductor layer made only of the refractory metal material is employed as the word line as disclosed in the literature mentioned before, there is the problem that the word line breaks in the part in which the plate electrode of the capacitor and the word line intersect. The reason is that the conductor layer must be formed by sputtering or the like, so the step coverage of the word line is inferior. Moreover, the conductor layer is bad in the close adhesion to the SiO$_2$ film. Accordingly, the inter-layer insulating film between the plate electrode and the word line cannot be thickened. Consequently, even when the resistance of the word line is made low by the use of the refractory metal material, the capacitance between lines becomes large, abnd the time constant of the word line does not become sufficiently small. Therefore, the propagation delay time of signals is not sufficiently shortened.

(3) The refractory metal layer (molybdenum layer) which is the upper layer of the multilayer-structure conductor layer contains the semiconductor (silicon) which is the same material as that of the lower layer. Owing to this semiconductor, the close adhesion between the refractory metal layer of the upper layer and the semiconductor layer of the lower layer is ensured. In order to prevent both the layers from being separated by any heat treatment, for example, thermal diffusion, after the formation of the multilayer- structure conductor layer, the Si content of the semiconductor layer should preferably be about 40% weight or more.

(4) Si$_3$N$_4$ (silicon nitride) is employed as the dielectric of the charge storing capacitor. The specific permittivity of Si$_3$N$_4$ is about double that of SiO$_2$ which is usually used as the dielectric of a capacitor. Therefore, the capacitance per unit area of the capacitor employing Si$_3$N$_4$ is large. As a result, the occupying area of the capacitors can be reduced, and the high packaging of the D-RAM can be achieved.

(5) Since the second layer of wiring in the multilayer structure overlies the polycrystalline silicon layer, it is capable of direct contact with the semiconductor regions formed in the semiconductor substrate. Accordingly, the layout of the second layer of wiring can be made versatile.

Now, the 64 kbit D-RAM of the present embodiment will be described more concretely.

Figure 2:
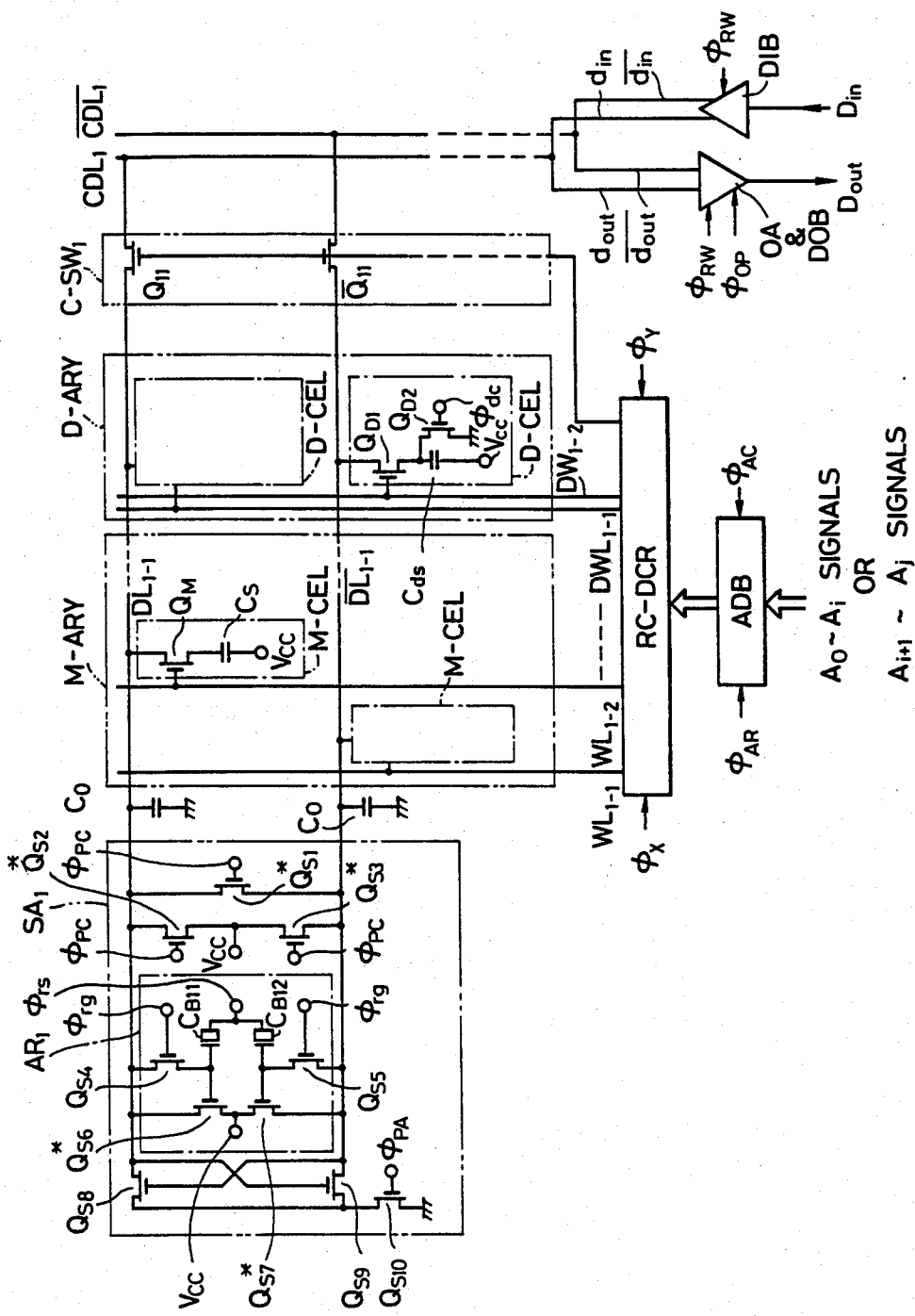
FIG. 2 is a circuit diagram of a 64 kbit D-RAM according to the present invention.

FIG. 2 is a circuit diagram of the 64 kbit D-RAM according to the present invention. The principal portions of this D-RAM are a memory array M-ARY which is composed of a plurality of memory cells M-CELs, and peripheral circuits, i.e., a sense amplifier SA$_1$, a dummy array D-ARY, a column switch C-SW$_1$, a row decoder and column decoder RC-DCR, an address buffer ADB, a data input buffer DIB, and a data output buffer DOB.

The M-ARY is an area where the memory cells M-CELs each being a unit for storing an information gather, and the peripheral circuits perform such functions as selecting one memory cell M-CEL and reading, amplifying and delivering the information. More specifically, the ADB converts address signals A$_0$-A$_i$ and A$_{i+1}$-A$_j$ entered from outside an IC, into proper signals and then transmits the coverted signals to the RC-DCR. On the basis of these signals, the RC-DCR selects one word line, e.g., WL$_{1-2}$ and a pair of data lines DL$_{1-1}$ and $\overline{DL}_{1-1}$ corresponding to one column switch. As a result, one M-CEL is selected. The M-CEL stores the information in the form of the presence or absence of charges in a charge storing capacitor C$_S$. When a gate MISFET Q$_M$ is turned "on" by the signal applied to the WL$_{1-2}$, the information is read out onto the DL$_{1-1}$ in the form in which the charges in the C$_S$ are discharged. The SA$_1$ amplifies the read information, and the amplified information is delivered via the DOB.

Figure 3:
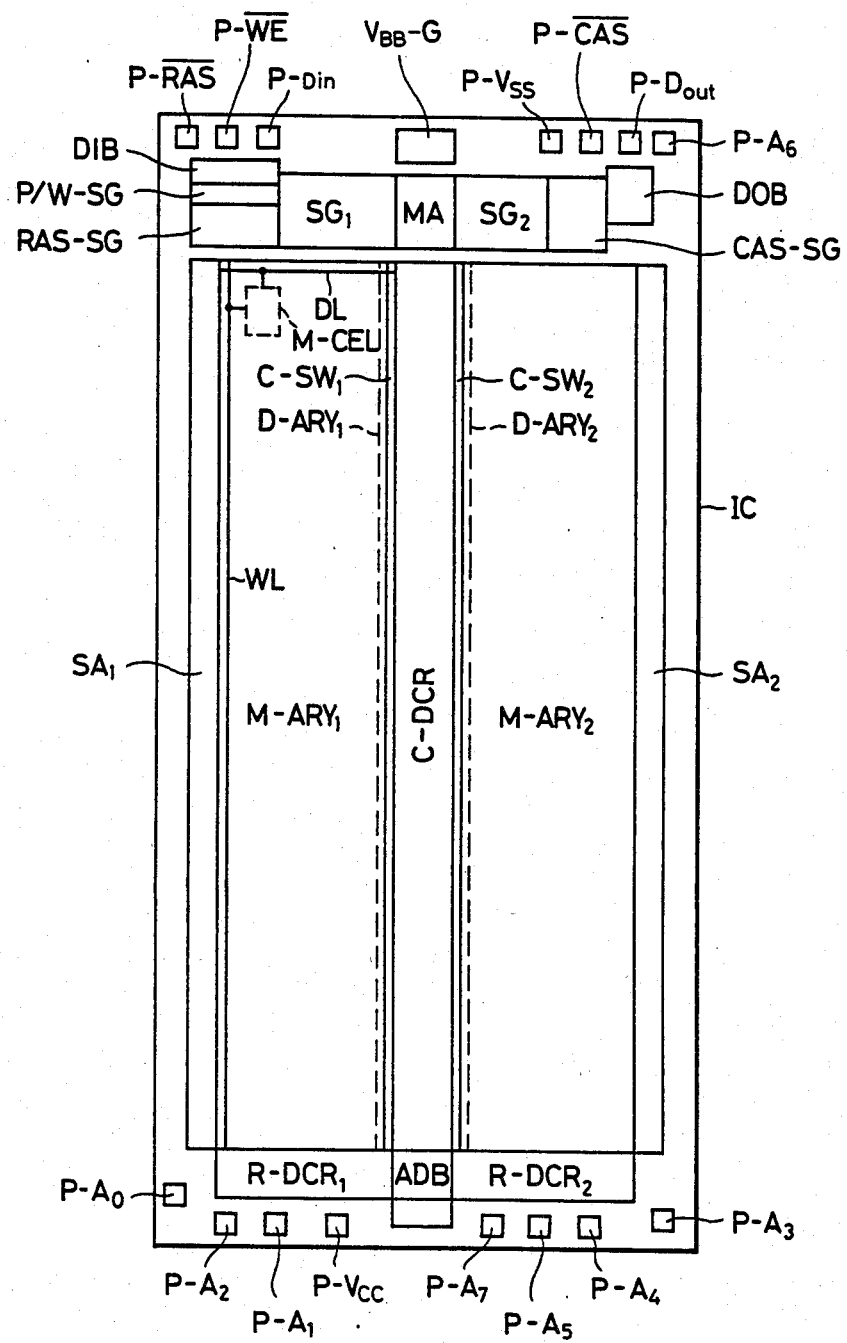
FIG. 3 is a plan view of the IC chip of the 64 kbit D-RAM according to the present invention.

Now, the layout pattern of the 64 kbit D-RAM circuit shown in FIG. 2 will be described with reference to FIG. 3.

Two memory arrays M-ARY$_1$ and M-ARY$_2$ each being constructed of a plurality of memory cells M-CELs are arranged centrally of a chip. They occupy about 60% of the area of the chip. In the peripheries of the memory arrays, there are arranged as in the figure the peripheral circuits shown in FIG. 2, namely, sense amplifiers SA$_1$ and SA$_2$, row decoders R-DCR$_1$ and R-DCR$_2$, column switches C-SW$_1$ and C-SW$_2$ and dummy arrays D-ARY$_1$ and D-ARY$_2$ which correspond to the respective memory arrays, and an address buffer ADB, a column decoder C-DCR, a data input buffer DIB and a data output buffer DOB which is common to the two memory arrays.

As illustrated in FIG. 2, in the M-ARY$_1$ by way of example, 256 word lines WLs extending from the R-DCR$_1$ intersect with 256 data lines DLs which extend from the C-DCR and through the C-SW$_1$ as well as the D-ARY$_1$ in a manner to be orthogonal to the WLs. One M-CEL is disposed in correspondence with each point of intersection. As shown in FIG. 3, the WL is much longer than the DL. Therefore, it is indispensable to the fast operation of the D-RAM to shorten the propagation delay time of a signal on the WL.

Besides the aforementioned circuits, there are arranged as in the figure a read/write signal generator R/W-SG, a RAS (row address) signal generator RAS-SG, a RAS-system signal generator SG$_1$, a CAS (column address) signal generator CAS-SG, a CAS-system signal generator SG$_2$, a main amplifier MA and a V$_{BB}$ voltage generator V$_{BB}$-G.

Along the upper edge and lower edge of the chip, bonding pads P-$\overline{RAS}$, P-$\overline{WE}$, P-D$_{in}$, P-V$_{SS}$, P-$\overline{CAS}$, P-D$_{out}$, P-V$_{CC}$ and P-A$_0$ to P-A$_7$ for introducing inputs from outside the D-RAM IC into the IC chip are arranged as shown in the figure.

Now, practicable device structures in the 64 kbit D-RAM will be described with reference to perspective sectional views of FIGS. 4, 5 and 6.

DEVICE STRUCTURE OF MEMORY CELL

Figure 4:
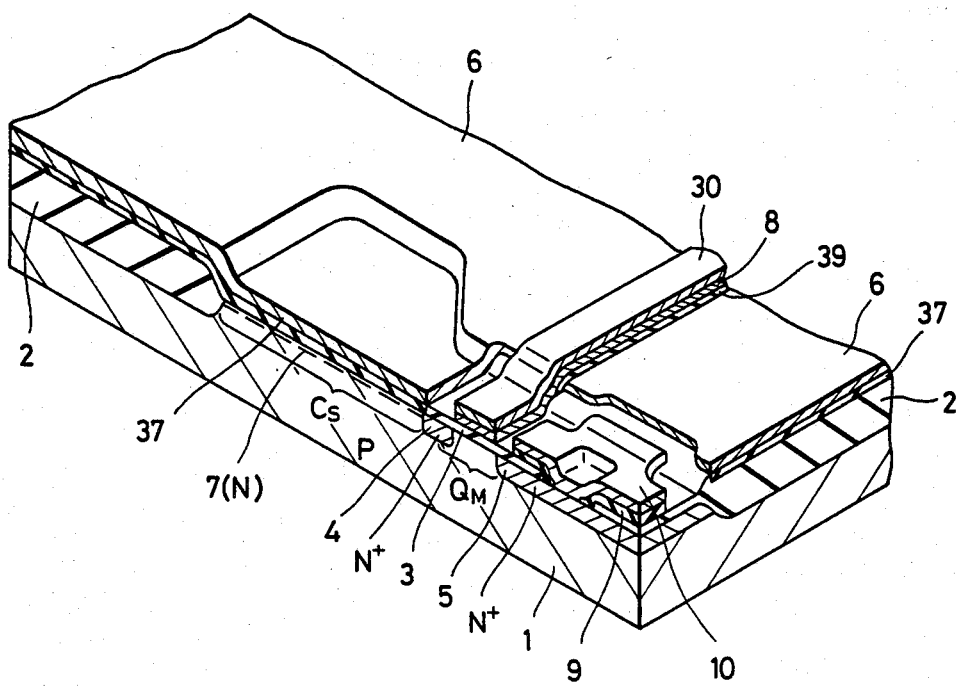
FIG. 4 is a perspective sectional view of a memory cell according to the present invention.

FIG. 4 is a perspective sectional view showing the device structure of a single memory cell M-CEL. Numeral 1 designates a P-type semiconductor substrate, numeral 2 a comparatively thick insulating film (hereinbelow, termed "field insulating film") made of SiO$_2$, numeral 3 a comparatively thin insulating film (hereinbelow, termed "second gate insulating film") made of SiO$_2$, numeral 37 a multilayer insulating film (hereinbelow, termed "first gate insulating film") made of an SiO$_2$ film and an Si$_3$N$_4$ film overlying it, numerals 4 and 5 N$^+$-type semiconductor regions, numeral 6 a first polycrystalline silicone layer, numeral 7 an N-type surface inversion layer, numeral 8 a second polycrystalline silicon layer, numeral 30 a molybdenum layer containing silicon, numeral 9 a PSG (phospho-silicate glass) layer, and numeral 10 an aluminum layer.

The MISFET Q$_M$ in the single memory cell M-CEL has its substrate, source region, drain region, gate insulating film and gate electrode made up of the aforementioned P-type semiconductor substrate 1, N$^+$-type semiconductor region 4, N$^+$-type semiconductor region 5, second gate insulating film 3 and a multilayer electrode consisting of the second polycrystalline silicon layer 8 and the silicon-containing molybdenum layer 30, respectively. The multilayer electrode is used as, for example, the word line WL$_{1-2}$ shown in FIG. 2. The aluminum layer 10 connected to the N$^+$-type semiconductor region 5 is used as, for example, the data line $DL_{1-1}$ shown in FIG. 2.

On the other hand, the capacitor for storage (information storing capacitor) $C_S$ in the memory cell M-CEL has its own electrode, dielectric layer and other electrode made up of the first polycrystalline silicon layer 6, first gate insulating film 37 and N-type surface inversion layer 7, respectively. Since the supply voltage $V_{CC}$ is applied to the first polycrystalline silicon layer 6, it induces the N-type surface inversion layer 7 in the surface of the P-type semiconductor substrate 1 owing to the field effect through the first gate insulating film 37.

DEVICE STRUCTURE OF DUMMY CELL

Figure 5:
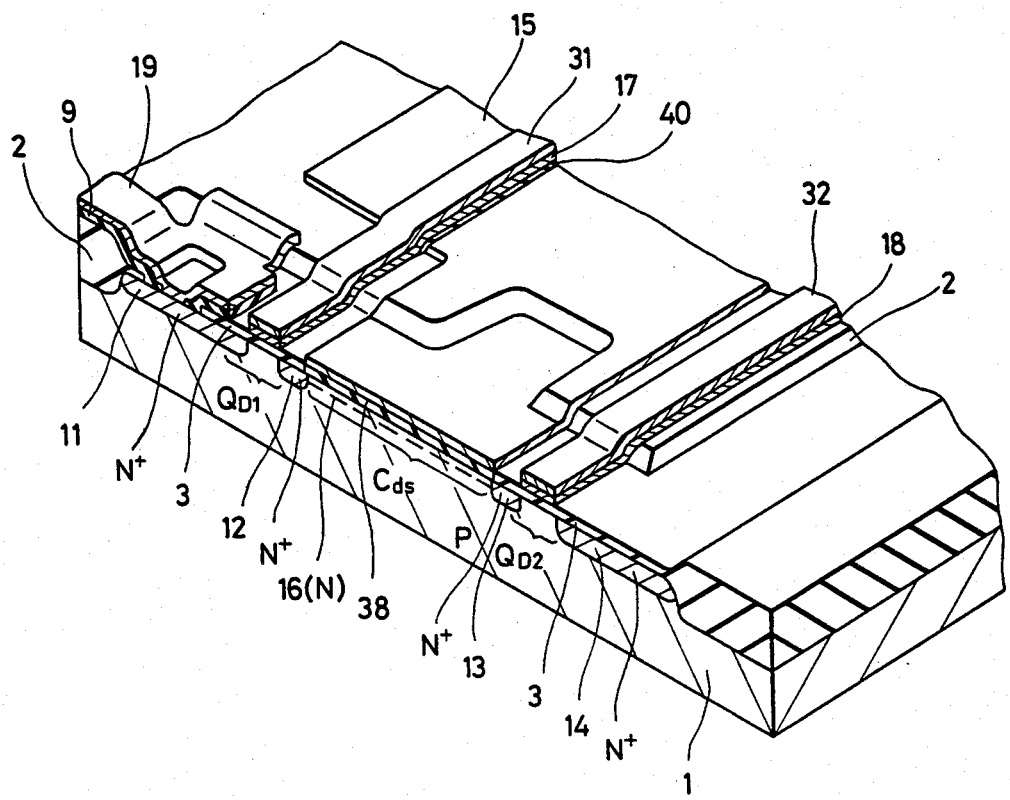
FIG. 5 is a perspective sectional view of a dummy cell according to the present invention.

FIG. 5 is a perspective sectional view showing the device structure of a single dummy cell D-CEL. In FIG. 5, specifically numerals 11 to 14 designate N+-type semiconductor regions, numeral 15 a first polycrystalline silicon layer, numeral 38 a multilayer first gate insulating film consisting of an $SiO_2$ film and an $Si_3N_4$ film overlying it, numeral 16 an N-type surface inversion layer, numerals 17 and 18 second polycrystalline silicon layers, numerals 31 and 32 molybdenum layers containing silicon, and numeral 19 an aluminum layer.

A MISFET $Q_{D1}$ in the single dummy cell D-CEL has its substrate, drain region, source region, gate insulating film and gate electrode made up of the P-type semiconductor substrate 1, N+-type semiconductor region 11, N+-type semiconductor region 12, second gate insulating film 3 and a multilayer electrode consisting of the second polycrystalline silicon layer 17 and the silicon-containing molybdenum layer 31, respectively. This multilayer electrode extends on the P-type semiconductor substrate 1 as, for example, a dummy word line $DWL_{1-2}$ shown in FIG. 2. The aluminum layer 19 connected to the N+-type semiconductor region 11 extends on the P-type semiconductor substrate 1 as, for example, the dummy data line $\overline{DL}_{1-1}$ shown in FIG. 2.

A MISFET $Q_{D2}$ in the dummy cell D-CEL has its substrate, drain region, source region, gate insulating film and gate electrode made up of the P-type semiconductor substrate 1, N+-type semiconductor region 13, N+-type semiconductor region 14, second gate insulating film 3 and a multilayer electrode consisting of the second polycrystalline silicon layer 18 and the silicon-containing molybdenum layer 32, respectively. This multilayer electrode is supplied with a discharge signal $\phi_{dc}$ shown in, for example, the dummy cell D-CEL in FIG. 2.

A capacitor $C_{ds}$ in the dummy cell D-CEL has its one electrode, dielectric layer and other electrode made up of the first polycrystalline silicon layer 15, first gate insulating film 38 and N-type surface inversion layer 16, respectively. Since the supply voltage $V_{CC}$ is applied to the first polycrystalline silicon layer 15, it induces the N-type surface inversion layer 16 in the surface of the P-type semiconductor substrate 1 owing to the field effect through the first gate insulating film 38.

Figure 6:
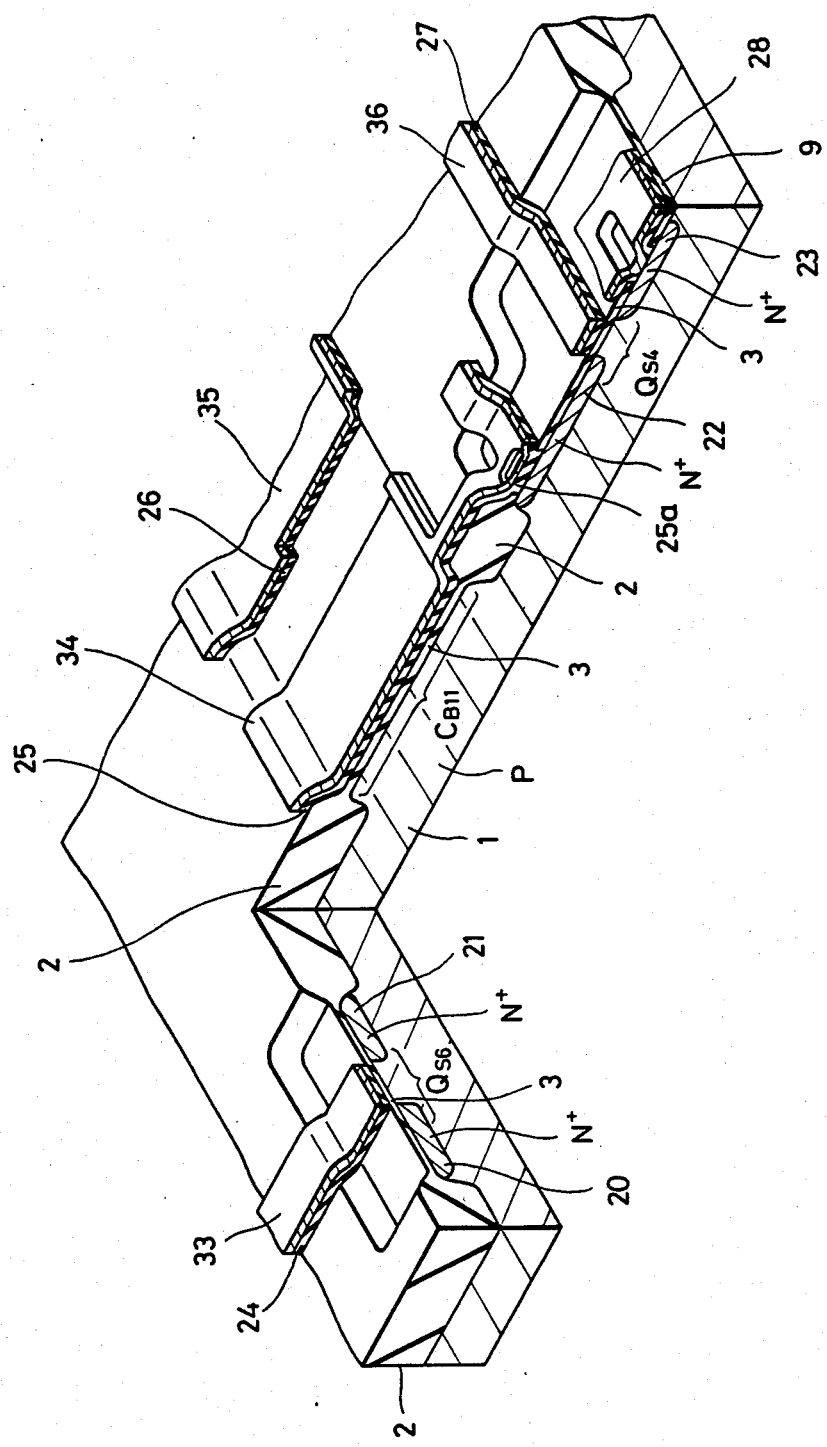
FIG. 6 is a partial perspective sectional view of a semiconductor device which constitutes a peripheral circuit according to the present invention.

FIG. 6 is a partial perspective sectional view which shows the structures of some devices in the peripheral circuit that is formed in the periphery of the memory array M-ARY of the D-RAM according to the present invention, for example, an active restore $AR_1$ that is shown in FIG. 2. In FIG. 6, specifically numerals 20 to 23 indicate N+-type semiconductor regions, numerals 24 to 27 second polycrystalline silicon layers, numerals 33 to 36 molybdenum layers containing silicon, and numeral 28 an aluminum layer.

A MISFET $Q_{S6}$ in the active restore $AR_1$ shown in FIG. 2 has its substrate, source region, drain region, gate insulating film and gate electrode made up of the P-type semiconductor substrate 1, N+-type semiconductor region 20, N+-type semiconductor region 21, second gate insulating film 3 and a multilayer electrode consisting of the second polycrystalline silicon layer 24 and the silicon-containing molybdenum layer 33, respectively.

A MISFET $Q_{S4}$ in the active restore $AR_1$ has its substrate, source region, drain region, gate insulating film and gate electrode made up of the P-type semiconductor substrate 1, N+-type semiconductor region 22, N+-type semiconductor region 23, second gate insulating film 3 and a multilayer electrode consisting of the second polycrystalline silicon layer 27 and the silicon-containing molybdenum layer 36, respectively. This multilayer electrode is supplied with an active restore control signal $\phi_{rg}$ shown in FIG. 2.

A capacitor $C_{B11}$ in the active restore $AR_1$ has its one electrode and dielectric layer made up of a multilayer electrode consisting of the second polycrystalline silicon layer 25 and the silicon-containing molybdenum layer 34, and the second gate insulating film 3, respectively. The multilayer electrode is continuously connected to the already-stated multilayer electrode which is used as the gate electrode of the MISFET $Q_{S6}$. A part 25a of the second polycrystalline silicon layer 25 constituting the above multilayer electrode is directly connected to the N+-type semiconductor region 22 of the MISFET $Q_{S4}$. The reason is that, when the second polycrystalline silicon layer 25 and the N+-type semiconductor region 22 are connected through an aluminum wiring layer, the contact area between the second polycrystalline silicon layer 25 and the aluminum wiring layer is necessary, so the wiring density cannot be enhanced. Accordingly, the connection means stated above is adopted for enhancing the wiring density.

The other electrode of the aforementioned capacitor $C_{B11}$ is formed by an inversion layer which is formed in the surface of the semiconductor substrate 1. This inversion layer is established by a voltage supplied to the multilayer electrode. The inversion layer is continuous to an N+-type semiconductor region which is formed in the semiconductor substrate 1 and to which the active restore control signal $\phi_{rs}$ in FIG. 2 is applied, though the region is not shown in FIG. 6.

A multilayer electrode consisting of the second polycrystalline silicon layer 26 and the silicon-containing molybdenum layer 35 is one electrode of a capacitor $C_{B12}$ shown in FIG. 2. A part of the multilayer electrode is directly connected to the source region of a MISFET $Q_{S5}$ shown in FIG. 2, likewise to the capacitor $C_{B11}$, while the other part is continuously connected to the gate electrode of a MISFET $Q_{S7}$.

Referring now to FIGS. 7, 8, 9 and 10, layout patterns in the 64 kbit D-RAM will be described.

LAYOUT PATTERNS OF MEMORY ARRAY AND DUMMY ARRAY

The layout patterns of the memory array M-ARY and the dummy array D-ARY will be described with reference to FIG. 7.

Figure 7:
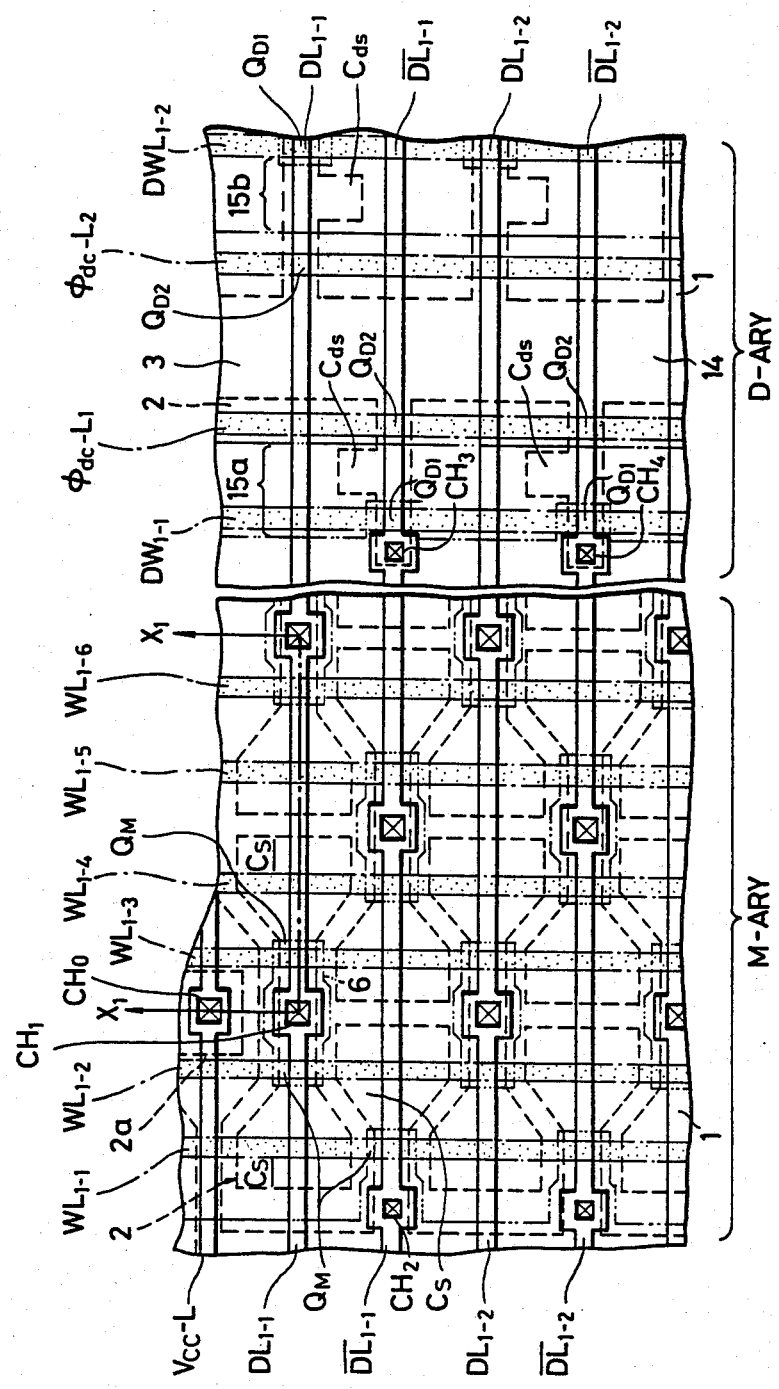
FIG. 7 is a plan view of the memory array and dummy array according to the present invention.

The memory array M-ARY shown in FIG. 7 is such that a plurality of memory cells M-CELs as shown in FIG. 4 are arrayed on the semiconductor substrate 1.

On the other hand, the dummy array D-ARY shown in FIG. 7 is such that a plurality of dummy cells D-CELs as shown in FIG. 5 are arrayed on the semiconductor substrate 1.

First, the memory array M-ARY shown in FIG. 7 is constructed as stated below.

Figure 8:
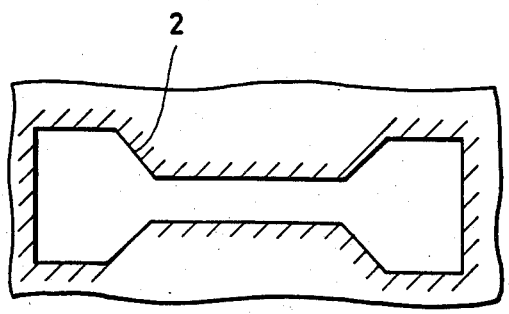
FIG. 8 is a plan view showing the basic pattern of a field insulating film within the memory array according to the present invention.

In order to isolate from one another the plurality of memory cells M-CELs, each being constructed of the MISFET $Q_M$ and the storage capacitor $C_S$, in the surface of the semiconductor substrate 1, the field insulating film 2 is formed in a manner to have a basic pattern shown in FIG. 8.

Unlike such basic pattern rule, a field insulating film 2a is exceptionally arranged under a contact hole $CH_0$ for applying the supply voltage $V_{CC}$ to the first polycrystalline silicon layer 6. It is accordingly possible to prevent the fault that an aluminum-silicon alloy which is produced on the basis of the interaction between the aluminum layer and the polycrystalline silicon layer near the contact hole $CH_0$ penetrates the insulating film immediately underlying the contact hole $CH_0$ and undesirably reaches the surface of the semiconductor substrate 1.

Figure 9:
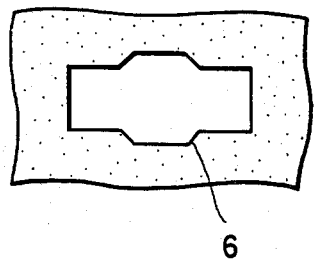
FIG. 9 is a plan view showing the basic pattern of a first layer of polycrystalline silicon within the memory array according to the present invention.

On the field insulating film 2 and the first gate insulating film 37, the first polycrystalline silicon layer 6 which is used as one electrode of the storage capacitor $C_S$ in the memory cell M-CEL is formed in a manner to have a basic pattern shown in FIG. 9.

Further, on the first polycrystalline silicon layer 6, word lines $WL_{1-1}$ to $WL_{1-6}$ each of which is formed by the multilayer wiring composed of the second polycrystalline silicon layer 8 and the silicon-containing molybdenum layer 30 in FIG. 4 extend in the vertical direction of FIG. 7.

Further, a power feed line $V_{CC-L}$ for supplying the supply voltage $V_{CC}$ through the contact hole $CH_0$ to the polycrystalline silicon layer 6 serving as one electrode of the storing capacitor $C_S$ extends in the lateral direction of FIG. 7.

On the other hand, the data lines $DL_{1-1}$ and $\overline{DL}_{1-1}$ each of which is formed by the aluminum layer 10 in FIG. 4 extend substantially in parallel with the power feed line $V_{CC-L}$ as shown in FIG. 7. The data line $DL_{1-1}$ is connected to the drain region of the MISFET $Q_M$ in the memory cell M-CEL through a contact hole $CH_1$, while the data line $\overline{DL}_{1-1}$ is connected to the drain region of the MISFET $Q_M$ in another memory cell M-CEL through a contact hole $CH_2$. Likewise to the data lines $DL_{1-1}$ and $\overline{DL}_{1-1}$, the data lines $DL_{1-2}$ and $\overline{DL}_{1-2}$ extend in the lateral direction of FIG. 7, and in predetermined parts thereof, they are connected to the drain regions of the MISFETs $Q_M$ in the memory cells M-CELs through contact holes.

Secondly, the dummy array D-ARY shown in FIG. 7 is constructed as stated below.

The field insulating film 2 is formed on a part of the surface of the semiconductor substrate 1, while the first and second gate insulating films 38 and 3 are formed on the other part of the surface of the semiconductor substrate 1.

On the field insulating film 2 and the gate insulating film 38, first polycrystalline silicon layers 15a and 15b extend in the vertical direction as viewed in FIG. 7 and in a manner to be spaced from each other. The width of each of the first polycrystalline silicon layer 15a and 15b is very important in determining the capacitance value of the capacitor $C_{ds}$ in the dummy cell D-CEL. The $N^+$-type semiconductor region 14 shown in FIG. 5 is located between these first polycrystalline silicon layers 15a and 15b. The $N^+$-type semiconductor region 14 is used as the common earth line of a plurality of dummy cells D-CELs.

Further, the dummy word line $DWL_{1-1}$ which is formed by the multilayer electrode consisting of the second polycrystalline silicon layer 17 and the silicon-containing molybdenum layer 31 in FIG. 5 extends on the first polycrystalline silicon layer 15a. This dummy word line $DWL_{1-1}$ constructs the gate electrode of the MISFET $Q_{D1}$ in the dummy cell D-CEL. On the other hand, a control signal line $\phi_{dc-L1}$ which is formed by the multilayer electrode consisting of the second polycrystalline silicon layer 18 and the silicon-containing molybdenum layer 32 in FIG. 5 and which serves to apply the discharge control signal $\phi_{dc}$ illustrated in FIG. 2 is spaced from the dummy word line $DWL_{1-1}$ and extends in parallel therewith. This control signal line $\phi_{dc-L2}$ constructs the gate electrode of the MISFET $Q_{D2}$ in the dummy cell D-CEL.

Similarly, the dummy word line $DWL_{1-2}$ and the control signal line $\phi_{dc-L2}$ extend in parallel with the dummy word line $DWL_{1-1}$ and the control signal line $\phi_{dc-L1}$.

Further, the data lines $DL_{1-1}$, $\overline{DL}_{1-1}$, $DL_{1-2}$ and $\overline{DL}_{1-2}$ extend from the memory array M-ARY as shown in FIG. 7. The $\overline{DL}_{1-1}$ is connected to the drain region of the MISFET $Q_{D1}$ of the dummy cell D-CEL through a contact hole $CH_3$, and the $\overline{DL}_{1-2}$ is similarly connected to the drain region of the MISFET $Q_{D1}$ in another D-CEL through a contact hole $CH_4$.

LAYOUT PATTERN OF PERIPHERAL CIRCUIT

Figure 10:
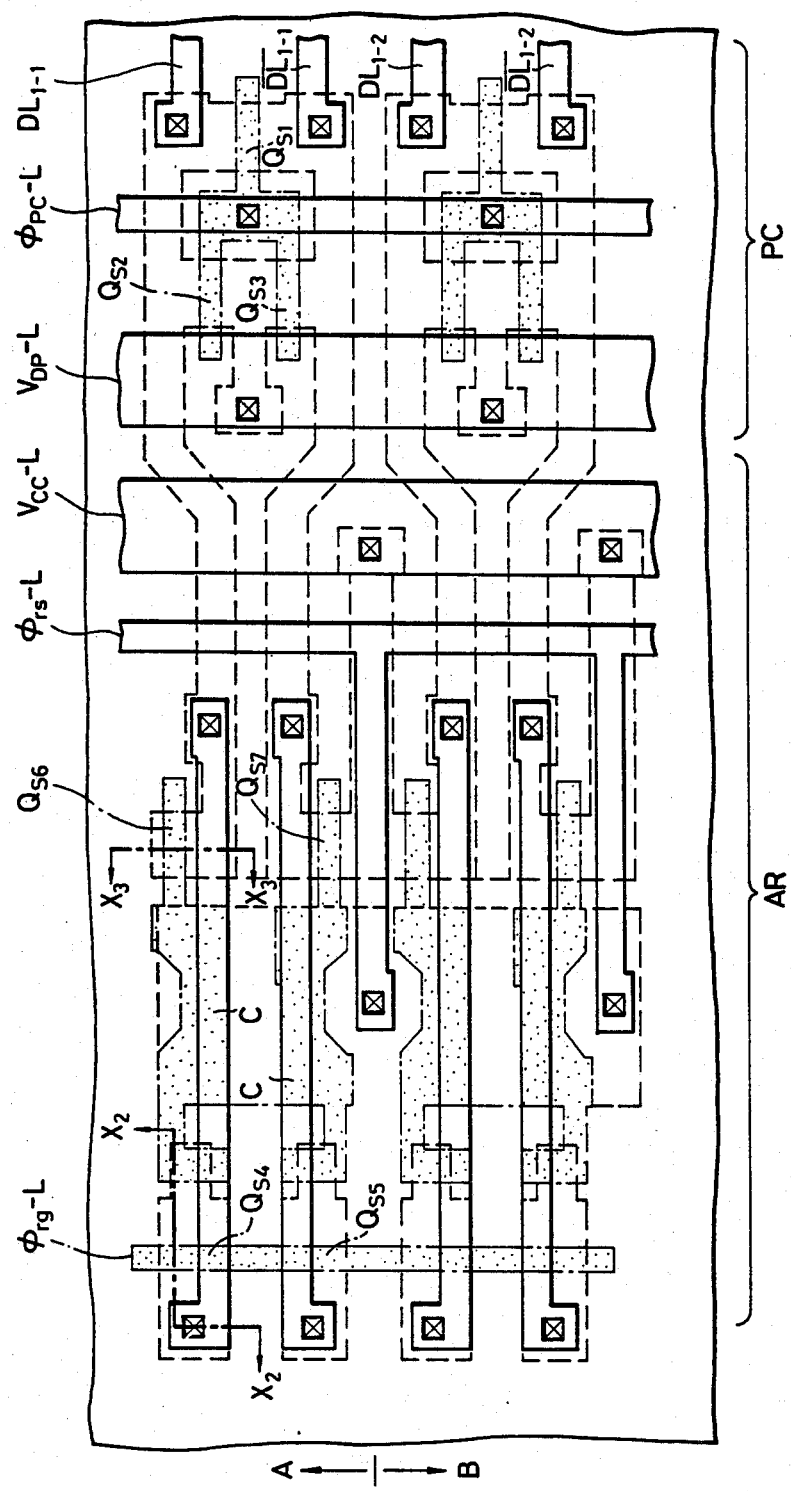
FIG. 10 is a plan view of the semiconductor device which constitutes the peripheral circuit according to the present invention.

The layout pattern of a part of the peripheral circuit, for example, the sense amplifier $SA_1$ shown in FIG. 2 is illustrated in FIG. 10.

In FIG. 10, AR indicates an active restore portion, and PC a circuit portion for precharging the data lines.

Two active restores $AR_1$ as shown in FIG. 2 are arranged in the active restore portion AR. That is, one active restore is constructed on the side of arrow A shown in FIG. 10, while the other active restore on the side of arrow B. In the active restore portion AR, active restore control signal lines $\phi_{rg-L}$ and $\phi_{rs-L}$ and a supply voltage line $V_{CC-L}$ which are common to the respective active restores are arranged as shown in FIG. 10.

On the other hand, in the precharging circuit portion PC, two data line precharging circuits corresponding to the two active restores are arranged. In the precharging circuit portion PC, a potential line $V_{DP-L}$, a precharge control signal $\phi_{PC-L}$, and the data lines $DL_{1-1}$, $\overline{DL}_{1-1}$, $DL_{1-2}$ and $\overline{DL}_{1-2}$ extending to the memory array M-ARY in FIG. 7 are arranged as shown in FIG. 10.

The MISFETs $Q_{S1}$ to $Q_{S7}$ and the capacitors $C_{B11}$ and $C_{B12}$ in FIG. 2 are arranged as shown in FIG. 10.

Now, the manufacturing process of the 64 kbit D-RAM will be described with reference to FIGS. 11 to 26. In each of the figures, $X_1$ denotes a sectional process diagram of a section $X_1$—$X_1$ of the memory array M-ARY shown in FIG. 7, $X_2$ a sectional process diagram of a section $X_2$—$X_2$ of the active restore AR shown in FIG. 10, and $X_3$ a sectional process diagram of a section $X_3$—$X_3$ of the active restore AR shown in FIG. 10.

STEPS OF FORMING OXIDE FILM AND OXIDATION-PROOF FILM

Figure 11:
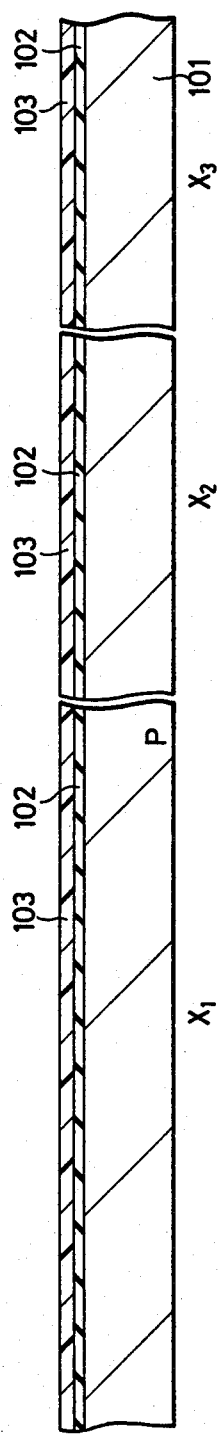

As shown in FIG. 11, an oxide film 102 and an insulating film which does not allow oxygen to pass therethrough, i.e., an oxidation-proof film 103 are formed on the surface of a semiconductor substrate 101.

As favorable concrete materials of the semiconductor substrate 101, oxide film 102 and oxidation-proof film 103, there are respectively used a P-type single-crystal silicon (Si) substrate having the (100) crystal, a silicon dioxide ($SiO_2$) film and a silicon nitride ($Si_3N_4$) film.

The $SiO_2$ film 102 is formed to a thickness of approximately 500 Å by the surface oxidation of the Si substrate 101, for the following reason. In case the $Si_3N_4$ film 103 has been formed directly on the surface of the Si substrate 101, a thermal distortion develops in the surface of the Si substrate 101 on account of the discrepancy between the coefficients of thermal expansion of the Si substrate 101 and the $Si_3N_4$ film 103. Therefore, crystal defects are caused in the surface of the Si substrate 101. In order to prevent this drawback, the $SiO_2$ film 102 is formed on the surface of the Si substrate 101 before the formation of the $Si_3N_4$ film 103.

On the other hand, the $Si_3N_4$ film 103 is formed to a thickness of approximately 1400 Å by, e.g. the CVD (Chemical Vapor Deposition) process because it is used as a mask for the selective oxidation of the Si substrate 101 as will be described in detail later.

STEPS OF SELECTIVELY REMOVING OXIDATION-PROOF FILM AND IMPLANTING IONS

In order to remove the selected parts of the $Si_3N_4$ film 103 which overlie those areas of the surface of the Si substrate 101 where a comparatively thick insulating film or a field insulating film, a photoresist film 104 is first formed on selected areas of the surface of the $Si_3N_4$ film 103 as an etching mask. Under this state, the exposed parts of the $Si_3N_4$ film 103 are removed by, e.g., the plasma etching capable of high-precision etching.

Figure 12:
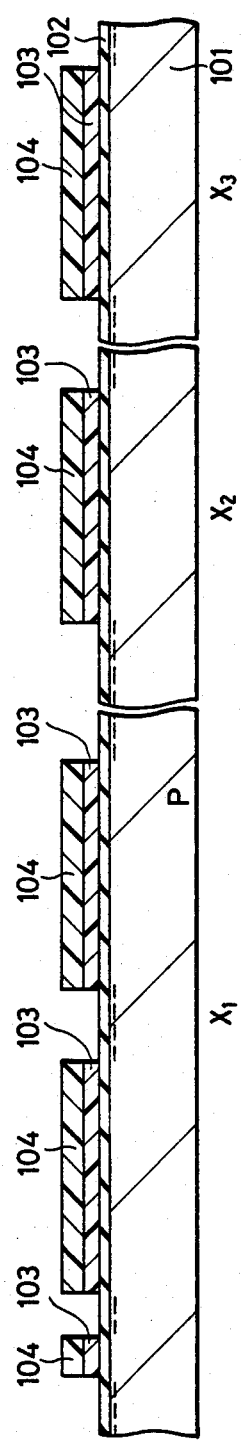

Subsequently, in order to prevent the so-called inversion layer or a layer of the conductivity type opposite to that of the Si substrate 101 from being formed in the surface of the substrate on which the field insulating film is formed, an impurity of the same conductivity type as that of the Si substrate 101 or a P-type impurity is introduced into the substrate through the $SiO_2$ film 102 exposed in the state in which the photoresist film 104 is left as shown in FIG. 12. The ion implantation is favorable as a method of introducing the P-type impurity. By way of example, boron ions of the P-type impurity are implanted into the Si substrate 101 at an implantation energy of 75 keV. An ion dose at this time is $3 \times 10^{12}$ atoms/cm$^2$.

STEP OF FORMING FIELD INSULATING FILM

Figure 13:
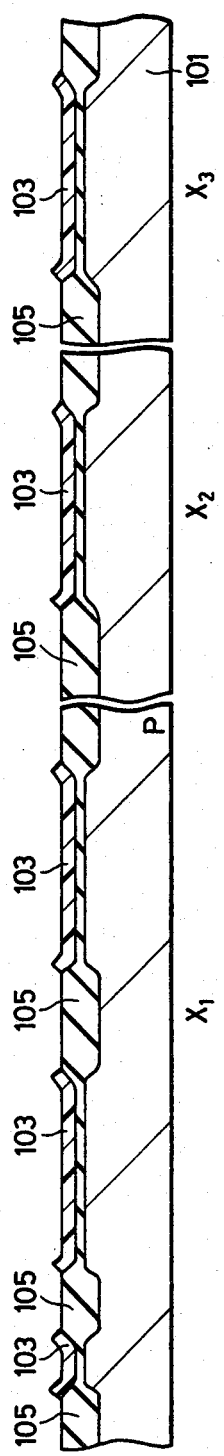

The field insulating film 105 is formed on the selected areas of the surface of the Si substrate 101. As shown in FIG. 13, after removing the photoresist film 104, the selected areas of the surface of the Si substrate 101 are oxidized by the thermal oxidation employing the $Si_3N_4$ film 103 as a mask, thereby to form the $SiO_2$ film 105 (hereinbelow, called "field $SiO_2$ film") which is approximately 9500 Å thick. During the formation of the field $SiO_2$ film 105, the ion-implanted boron is introduced into the Si substrate 101 by the drive-in diffusion, and a P-type inversion preventive layer (not shown) having a predetermined depth is formed directly under the field $SiO_2$ film 105.

STEPS OF REMOVING OXIDATION-PROOF FILM AND OXIDE FILM

In order to expose the areas of the surface of the Si substrate 101 where the field $SiO_2$ film 105 is not formed, the $Si_3N_4$ film 103 is removed with, e.g., a hot phosphoric acid ($H_3PO_4$) solution. Subsequently, the $SiO_2$ film 102 is removed with, e.g., a fluoric acid (HF) solution. Then, the selected areas of the surface of the Si substrate 101 are exposed as shown in FIG. 14.

STEP OF FORMING FIRST GATE INSULATING FILM

In order to obtain the dielectric layers of the capacitors $C_s$ and $C_{ds}$ in the memory cells M-CELs and dummy cells D-CELs, a first gate insulating film 106 is formed on the exposed areas of the surface of the Si substrate 101 as shown in FIG. 15. First, an $SiO_2$ film being approximately 150 Å thick is formed by thermally oxidizing the exposed areas of the surface of the Si substrate 101, whereupon an $Si_3N_4$ film being approximately 200 Å thick is formed on the entire surface by the CVD process. Accordingly, the first gate insulating film 106 is a multilayer film consisting of the $SiO_2$ film and the overlying $Si_3N_4$ film.

The reason why the $Si_3N_4$ film is deliberately used as the first gate insulating film 106 in this manner, is that the specific inductivity of $Si_3N_4$ is about double greater than that of $SiO_2$ as stated before. That is, even when the occupying areas of the capacitors $C_s$ and $C_{ds}$ are made small by forming the dielectric layers thereof by the use of the substance exhibiting the great specific inductivity, sufficient charge storing quantities are attained.

The reason why the thin $SiO_2$ film is formed before the formation of the $Si_3N_4$ film, is that the formation of the $Si_3N_4$ film directly on the Si substrate 101 is unfavorable as already described.

STEP OF DEPOSITING FIRST CONDUCTOR LAYER

In order to use it as one electrode of each of the capacitors in the memory cells and dummy cells, a first conductor layer 107 is formed on the entire surface of the Si substrate 101 as shown in FIG. 16. More specifically, e.g. a polycrystalline silicon layer 107 is formed on the entire surface of the Si substrate 101 as the first conductor layer 107 by the CVD process. The thickness of the polycrystalline silicon layer 107 is approximately 4000 Å. Subsequently, in order to lower the resistance of the polycrystalline silicon layer 107, an N-type impurity, e.g., phosphorus is introduced into the polycrystalline silicon layer 107 by the diffusion process. As a result, the resistance of the polycrystalline silicon layer 107 becomes approximately 30 Ω per square.

STEP OF REMOVING SELECTED PARTS OF FIRST CONDUCTOR LAYER

In order to bring the first conductor layer or first polycrystalline silicon layer 107 into a predetermined electrode configuration, the selected parts of the first polycrystalline silicon layer 107 are removed by the photoetching process as shown in FIG. 17, thereby to form electrodes 108. The plasma etching capable of high-precision etching is suitable as a method for the selective removal of the first polycrystalline silicon layer 107.

Subsequently, in the state in which the first gate insulating film 106 or the $Si_3N_4$ film and $SiO_2$ film is/are fully left, the surface of the electrode 108 made of the polycrystalline silicon layer 107 is oxidized by a heat treatment so as to form an $SiO_2$ film 110 being approximately 2200 Å thick. This $SiO_2$ film 110 performs the function of the inter-layer insulation between the electrode 108 and an electrode made of second polycrystalline silicon to be stated later.

At this time, a region covered with the $Si_3N_4$ film or any other region than the surface of the electrode 108 is not oxidized because the $Si_3N_4$ film is the oxygen-impermeable insulating film or the oxidation-proof film as already described.

STEP OF FORMING SECOND GATE INSULATING FILM

In order to obtain the gate insulating films of the MISFETs in the memory array M-ARY, the dummy array D-ARY and the peripheral circuit portion, a second gate insulating film 109 is formed as shown in FIG. 18.

First, the exposed parts of the first gate insulating film 106 or the $Si_3N_4$ film as well as $SiO_2$ film are removed to expose the corresponding parts of the surface of the Si substrate 101. The $Si_3N_4$ film is removed with, e.g., a hot phosphoric acid ($H_3PO_4$) solution and by employing an $SiO_2$ film 110 as a mask, whereupon the $SiO_2$ film being the exposed first gate insulating film is removed with, e.g., a fluoric acid (HF) solution. Since the mask for the removal of the $Si_3N_4$ film is the $SiO_2$ film 110, the $Si_3N_4$ film extends into the vicinity of the terminal part of the oxide film 110. At this time, the $Si_3N_4$ film is somewhat etched laterally from the terminal part of the oxide film 110. Since, however, the film is as thin as 200 Å, it may be said that an overhang scarcely appears. On the other hand, in removing the $SiO_2$ film which is the first gate insulating film, it is removed by lightly etching the whole surface without employing any mask. At this time, it is somewhat etched laterally from the terminal part of the $Si_3N_4$ film, but an overhang scarcely appears because it is as thin as 150 Å.

Subsequently, the exposed areas of the surface of the Si substrate 101 are thermally oxidized, whereby the second gate insulating film 109 being approximately 500 Å thick is formed on the surface. Accordingly, the second gate insulating film 109 is made of $SiO_2$. Simultaneously with the formation of the second gate insulating film or second gate $SiO_2$ film 109, the $SiO_2$ film 110 is lightly oxidized again. At this time, the very small overhang is removed.

STEP OF ION IMPLANTATION FOR LOW THRESHOLD VOLTAGE CONTROL

In order to regulate the low threshold voltages of the MISFETs $Q_{S1}$–$Q_{S3}$, $Q_{S6}$ and $Q_{S7}$ shown in FIG. 2, a P-type impurity is introduced into the substrate surface through the second gate $SiO_2$ film 109 by the ion implantation process as shown in FIG. 19. Boron, for example, is used as the P-type impurity. Preferably, the implantation energy is 75 keV, and the dose of ions is $2.4 \times 10^{11}$ atoms/cm$^2$.

Since the ion implantation at this time does not use any selective mask at all, the boron is also introduced into the surface parts of the substrate where other MISFETs, e.g., $Q_M$, $Q_{D1}$, $Q_{D2}$, $Q_{S4}$ and $Q_{S5}$ are to be formed.

STEP OF ION IMPLANTATION FOR HIGH THRESHOLD VOLTAGE CONTROL

Figure 20:
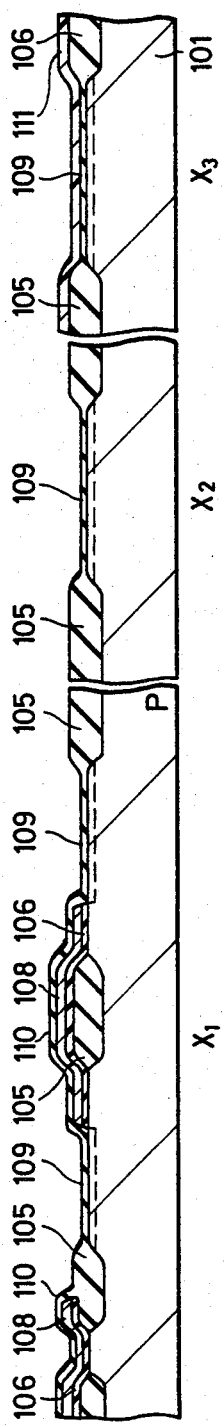

In order too regulate the threshold voltages of the MISFETs having threshold voltages higher than those of the MISFETs $Q_{S1}$–$Q_{S3}$, $Q_{S6}$ and $Q_{S7}$ shown in FIG. 2, for example, the MISFETs $Q_M$ in the memory cells, the MISFETs $Q_{D1}$ and $Q_{D2}$ in the dummy cells or the MISFETs $Q_{S4}$ and $Q_{S5}$ in the active restores, a mask for ion implantation or photoresist film 111 is formed on the parts of the second gate $SiO_2$ film 109 corresponding to the channel regions of the MISFETs $Q_{S1}$–$Q_{S3}$, $Q_{S6}$ and $Q_{S7}$ as illustrated in FIG. 20, and it is not formed on the channel regions of the MISFETs $Q_M$, $Q_{D1}$, $Q_{D2}$, $Q_{S4}$ and $Q_{S5}$. Under this state, boron ions are implanted. Preferably, the implantation energy is 75 keV, and the dose of the ions is $1.0 \times 10^{11}$ atoms/cm$^2$.

As a result, the impurity concentrations of the parts of the substrate surface where the MISFETs $Q_M$, $Q_{D1}$, $Q_{D2}$, $Q_{S4}$ and $Q_{S5}$ are to be formed are raised more, so that these MISFETs have the high threshold values.

STEP OF FORMING DIRECT CONTACT HOLE

Figure 21:
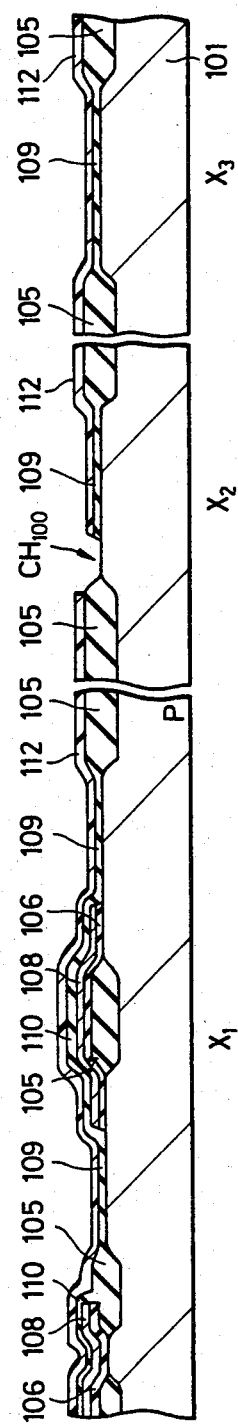

The so-called direct contact $CH_{100}$ or the contact hole for connecting one electrode 25 of the capacitor $C_{B11}$ directly to the N$^+$-type semiconductor region 22 of the MISFET $Q_{S4}$ as explained with reference to FIG. 6, is formed by the selective etching of the second gate $SiO_2$ film 109 and by employing a photoresist film 112 as a mask as illustrated in FIG. 21.

STEP OF DEPOSITING SECOND CONDUCTOR LAYER

Figure 22:
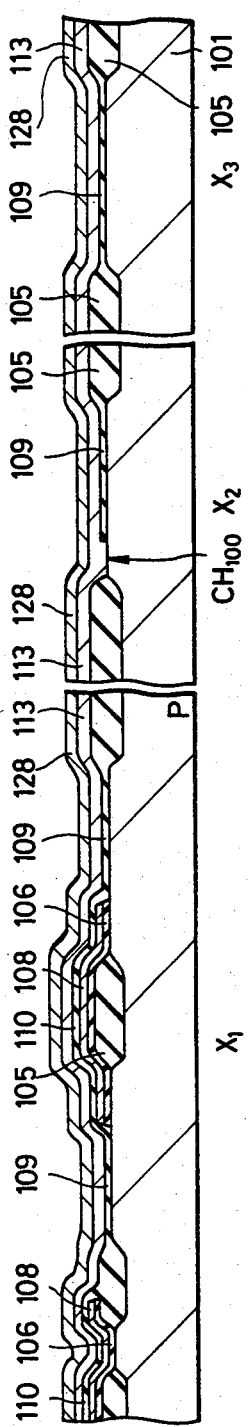

The second conductor layer is formed on the whole surface of the Si substrate 101 in order to use it as the gate electrodes of all the MISFETs and the wiring layer. More specifically, as shown in FIG. 22, a conductor layer of a multilayer structure (polycide) consisting of, e.g., a polycrystalline silicon layer 113 and a silicon-containing molybdenum (molybdenum silicide) layer 128 is formed on the whole surface of the Si substrate 101 as the second conductor layer. The multilayer-structure conductor layer is formed as stated below.

First, the polycrystalline silicon layer 113 is formed on the whole surface of the Si substrate 101 by the CVD process. The thickness of this polycrystalline silicon layer 113 is approximately 2000 Å. Subsequently, in order to lower the resistance, the polycrystalline silicon layer 113 is doped with an N-type impurity, for example, phosphorus by the diffusion process. As a result, the resistance of the polycrystalline silicon layer 113 becomes approximately 30 Ω per square. During such phosphorus treatment, the phosphorus impurity is introduced into the Si substrate 101 through the direct contact hole $CH_{100}$.

Next, the silicon-containing molybdenum layer 128 is formed on the whole surface of the polycrystalline silicon layer 113 to a thickness of approximately 3000 Å by, e.g., the co-sputtering process. At this time, the silicon content should preferably be at least 40% weight as stated before.

The resistivity of the multilayer-structure conductor layer thus obtained is 80 to 150 μΩ·cm.

STEP OF REMOVING SELECTED PARTS OF SECOND CONDUCTOR LAYER

The second conductor layer or the multilayer-structure conductor layer consisting of the second polycrystalline silicon layer 113 and the silicon-containing molybdenum layer 128 is selectively removed into predetermined electrode or wiring shapes by the plasma etching. As illustrated in FIG. 23, the multilayer-structure conductor after the etching forms the word lines $WL_{1-1}$ to $WL_{1-6}$, dummy word lines $DWL_{1-1}$ and $DWL_{1-2}$ and control signal lines $\phi_{dc-L1}$ and $\phi_{dc-L2}$ shown in FIG. 7 and also forms the active restore control signal line $\phi_{rg-L}$, electrodes of the capacitors $C_{B11}$ and $C_{B12}$ and gate electrodes of the MISFETs $Q_{S1}$ to $Q_{S3}$ shown in FIG. 10.

STEP OF FORMING SOURCE AND DRAIN REGIONS

In order to form the source and drain regions of the MISFETs in the selected parts of the Si substrate 101, an N-type impurity, e.g., arsenic is introduced into the Si substrate 101 through the second gate insulating film or $SiO_2$ film 109 as illustrated in FIG. 24. The ion implantation is favorable as a method of introducing the N-type impurity. By way of example, arsenic ions are implanted into the Si substrate 101 at an implantation energy of 80 keV. The dose of the ions at this time is $1 \times 10^{16}$ atoms/cm$^2$.

STEP OF FORMING INTER-LAYER INSULATING FILM

An inter-layer insulating film is formed on the whole surface of the Si substrate 101. More specifically, an inter-layer insulating film 118, e.g., a phospho-silicate glass (PSG) film being approximately 8000 Å thick is formed on the whole surface of the Si substrate 101 as shown in FIG. 25. This PSG film 118 serves also as a getter for sodium ions which affect the characteristics of the MISFETs.

STEP OF FORMING CONTACT HOLES

Contact holes are formed in the PSG film 118 and the second gate $SiO_2$ film 109 for the connections between a third conductor layer and the multilayer-structure conductor layer consisting of the second polycrystalline silicon layer and the silicon-containing molybdenum layer and between the source and drain regions and the third conductor layer. That is, as shown in FIG. 25, The PSG film 118 and the second gate $SiO_2$ film 109 are selectively etched to form the contact holes $CH_{101}$ to $CH_{104}$.

Subsequently, in order to flatten the PSG film 118, this film is heat-treated at a temperature of approximately 1000° C. The heat treatment at this time subjects the ion-implanted arsenic impurity to the drive-in diffusion, and the N$^+$-type semiconductor regions 119 to 126 having a predetermined depth are formed. These N$^+$-type semiconductor regions 119 to 126 become the source and drain regions.

STEP OF FORMING THIRD CONDUCTOR LAYER

In order to form the power feed line $V_{CC-L}$ and the data lines $DL_{1-1}$, $\overline{DL}_{1-1}$, $DL_{1-2}$ and $\overline{DL}_{1-2}$ shown in FIG. 7, the third conductor layer, e.g., aluminum layer being 12000 Å thick is first formed on the whole surface of the Si substrate 101. Subsequently, this aluminum layer is selectively etched to form the power feed line $V_{CC-L}$, data line $DL_{1-1}$ and wiring layer 127 as shown in FIG. 26.

The 64 kbit D-RAM is produced by the process explained above.

As apparent from the foregoing process, the gate electrodes (multilayer-structure conductor layer) of all the MISFETs in the D-RAM are simultaneously formed. It is accordingly easy to make the electrical characteristics, e.g., threshold voltages $V_{th}$ of the respective MISFETs uniform.

As stated before, the conductor layer of the multilayer structure causing no separation is employed as the gate electrodes of the MISFETs. Therefore, even when circuits such as, especially, the sense amplifier amplifying minute signals are constructed of the MISFETs of such gate electrodes, no problem is involved.

In the foregoing process, a modification to be stated below is possible.

In FIG. 23, after the polycrystalline silicon layer 113 and the silicon-containing molybdenum layer 128 have been selectively removed, the exposed parts of the second gate insulating film 109 are further removed continually by the etching so as to expose the surface parts of the substrate 101.

Next, the exposed parts of the surface of the Si substrate 101 are thermally oxidized to form an $SiO_2$ film having a thickness of approximately 100 Å, in order that the surface parts to form the source and drain regions of the MISFETs may not be contaminated. Simultaneously with the formation of the $SiO_2$ film, the surfaces of the polycrystalline silicon layer 113 and the silicon-containing molybdenum layer 128 which form the foregoing multilayer-structure conductor layer are oxidized, with the result that these surfaces are also formed with an $SiO_2$ film being approximately 300 Å thick.

This $SiO_2$ film is formed in such a manner that silicon in the silicon-containing molybdenum layer 128 precipitates. Owing to the precipitation of the silicon, the silicon content becomes lower than 40 weight-%, and the resistivity of the silicon-containing molybdenum layer 128 lowers. Accordingly, a D-RAM which is higher in the operating speed than the foregoing embodiment is obtained. In an example, the silicon content became below 40% weight after the formation of the $SiO_2$ film, but separation etc. attendant upon a heat treatment hardly occurred.

As apparent from the above description, in the semiconductor memory device of the present invention, the gate electrodes of the MISFETs constituting the memory cells and the MISFETs constituting the peripheral circuits are formed by the second multilayer-structure conductor layer comprising the polycrystalline silicon layer and the silicon-containing molybdenum layer. On the other hand, the electrodes of the capacitors constituting the memory cells are formed by the first polycrystalline silicon layer.

The present invention set forth above is also applicable to a 256 kbit D-RAM which requires a still higher packaging or integration density and higher operating speed. As the refractory metal material, tantalum, tungsten and titanium may well be used besides molybdenum.

We claim:

1. In a semiconductor memory device including a memory cell array in which a plurality of memory cells each having a capacitor and an insulated gate type field effect transistor that are formed at a single semiconductor body are arrayed in rows and columns, said memory cell array including a data line in electrical connection with the source or drain regions of the insulated gate type field effect transistors of the memory cells arrayed in a respective row of said memory cell array, said data line being positioned to extend on the capacitors of the memory cells of the respective row of said memory array, and peripheral circuitry which is disposed in association with said memory cell array and which is constructed of insulated gate type field effect transistors formed at said semiconductor body; the improvement therein comprising:

that one electrode of each of the capacitors consists essentially of a single first layer of polycrystalline silicon which is formed on an insulating film formed on said semiconductor body; and that a gate electrode of each of the insulated gate type field effect transistors of said memory cells and said peripheral circuitry is made of a second layer of multilayer structure which is formed on an insulating film formed on said semiconductor body, and which comprises a lower layer of polycrystalline silicon and an upper layer of refractory metal silicide.

2. A semiconductor memory device according to claim 1, wherein a silicon content of said upper layer of said second layer of multilayer structure is at least 40% by weight.

3. A semiconductor memory device according to claim 1, wherein said refractory metal of said upper layer is molybdenum.

4. A semiconductor memory device according to claim 1, wherein said refractory metal of said upper layer is tungsten.

5. A semiconductor memory device according to claim 1, wherein said refractory metal of said upper layer is tantalum.

6. A semiconductor memory device according to claim 1, wherein said refractory metal of said upper layer is titanium.

7. A semiconductor memory device according to claim 1, wherein said second layer has a thermal oxide layer which is formed in its surface.

8. A semiconductor memory device according to claim 1, wherein said second layers of the respective insulated gate type field effect transistors arrayed in each column of said memory cell array are integrally formed in common and serve as a word line of said memory cell array.

9. A semiconductor memory device according to claim 1, wherein the gate electrodes of the insulated gate type field effect transistors of both said memory cells and said peripheral circuitry are made from the same second layer of multilayer structure, formed simultaneously on said single semiconductor body on areas thereof for the memory cells and on areas thereof for the peripheral circuitry, whereby said gate electrodes of the memory cells and peripheral circuitry can be simultaneously formed so that electrical characteristics of the insulated gate field effect transistors can easily be made uniform.

10. A semiconductor memory device according to claim 1, wherein the dielectric of the capacitor is made of silicon nitride.

11. A semiconductor memory device according to claim 1, wherein said lower layer of polycrystalline silicon has had an impurity doped therein to lower the resistance of said lower layer.

12. A semiconductor memory device according to claim 1, wherein the source or drain regions of said insulated gate type field effect transistors of the memory cells and of the peripheral circuitry are provided in said semiconductor body in self-alignment with at least the lower layer of polycrystalline silicon.

13. A semiconductor memory device according to claim 1, wherein each of said lower layer of polycrystalline silicon and said first layer of polycrystalline silicon are formed from different layers of polycrystalline silicon formed on the semiconductor body.

14. A semiconductor memory device according to claim 1, wherein the second layer of multilayer structure has formed thereon an $SiO_2$ film formed by thermal oxidation of the second layer, said thermal oxidation being performed so as to precipitate silicon from said upper layer of refractory metal silicide metal, to thereby lower the resistivity of said upper layer.

15. A semiconductor memory device according to claim 1, further comprising wiring layers, overlying said first layer of polycrystalline silicon, and made of said second layer of multilayer structure.

* * * * *